United States Patent
Liang

(10) Patent No.: US 12,074,013 B1
(45) Date of Patent: Aug. 27, 2024

(54) SYSTEM AND METHOD FOR IN-SITU PLASMA MODIFICATION

(71) Applicant: Qi Liang, North Potomac, MD (US)

(72) Inventor: Qi Liang, North Potomac, MD (US)

(*) Notice: Subject to any disclaimer, the term of this patent is extended or adjusted under 35 U.S.C. 154(b) by 741 days.

(21) Appl. No.: 16/945,842

(22) Filed: Aug. 1, 2020

(51) Int. Cl.
*H01J 37/32* (2006.01)

(52) U.S. Cl.
CPC .. *H01J 37/32623* (2013.01); *H01J 37/32192* (2013.01); *H01J 37/32715* (2013.01); *H01J 37/32917* (2013.01)

(58) Field of Classification Search
CPC ........... H01J 37/32642; H01J 37/32651; H01J 37/32633; H01J 37/32917; H01J 37/3299; H01J 37/32954; H01J 37/32972; H01J 37/32981; H01J 37/3244; H01J 37/32449; H01J 37/32192; H01J 37/32715
See application file for complete search history.

(56) References Cited

U.S. PATENT DOCUMENTS

| | | | | |
|---|---|---|---|---|
| 2007/0111339 | A1* | 5/2007 | Wege | H01J 37/32623 438/10 |
| 2009/0218212 | A1* | 9/2009 | Denpoh | C23C 16/509 156/345.43 |
| 2013/0084706 | A1* | 4/2013 | Zhao | H01J 37/32256 257/E21.252 |
| 2014/0302678 | A1* | 10/2014 | Paterson | H01L 29/66795 438/700 |
| 2016/0181130 | A1* | 6/2016 | Singh | H01J 37/32422 156/345.24 |
| 2018/0053629 | A1* | 2/2018 | Zhang | H01J 37/3299 |

* cited by examiner

Primary Examiner — Ram N Kackar
Assistant Examiner — Laureen Chan
(74) Attorney, Agent, or Firm — Tue Nguyen

(57) ABSTRACT

In a system containing a plasma chamber, a substrate, a substrate holder, a feedback and gas distribution mechanism, a device is inserted into the vicinity of a plasma to modify characteristics of the plasma. Feedback mechanism provides guidance for the selection and adjustment of the device, which generates localized and remote plasma around the device to compensate and improve the performance of the overall plasma. The thusly formed plasma can have persistent or enhanced plasma characteristics for an extended period of time up to hundreds of hours.

19 Claims, 14 Drawing Sheets

SYSTEM AND METHOD FOR IN-SITU PLASMA MODIFICATION

BACKGROUND OF THE INVENTION

Field of Invention

The present invention is related to a plasma apparatus containing a plasma tuning device and a method thereof, and more particularly, to a material deposition apparatus containing a plasma tuning device and a method thereof which are capable of in-situ modifying plasma characteristics for improved performance.

Description of Related Art

Plasma characteristics can include plasma shape, size, gas chemistry, power density, electron, ion densities and their distributions, etc. A conventional plasma system includes a pre-designed chamber pressure-controlled by adjusting gas inlet and gas exhaust flow rates, an energy coupling configuration component to ionize and sustain the plasma. Plasma characteristics are determined by system design methodology as well as the consistency between design specifications and components dimensions. It was also understood that plasma characteristics does not necessarily maintain the same during entire process, especially when chamber conditions undergo a change because of an active plasma process itself. It would be desirable to have a real-time means for in-situ monitoring plasma and correcting its characteristics in the areas of interests, without having to halt ongoing plasma processes. It would be further desirable to alternate selected plasma characteristics so that favorable plasma characteristics are still effective and in use during and after such plasma adjustment.

SUMMARY OF THE INVENTION

It is an object of the present disclosure to provide a system and method to furnish in-situ adjustment of a plasma, which can include a device disposed in a vicinity of the plasma to change a characteristic of the plasma, such as to change the temperature distribution of the plasma, to change the localization of the plasma density, to change the coverage of the plasma, or to change the gas chemistry of the plasma. It is also an object of the present disclosure that changing the characteristics of a plasma also changes substrate conditions in either material synthesis or material etching.

To achieve these and other advantages and in accordance with the purpose of the present disclosure, high temperature resistance devices with different shapes and dimensions are utilized by the method.

To achieve these and other advantages and in accordance with the purpose of the present disclosure, a number of stationary displacements, rotational movements, extending, retracting, and displacement of the device are utilized by the method.

To achieve these and other advantages and in accordance with the purpose of the present disclosure, a feedback mechanism is designed, comprising: a plasma characteristics tool, a central process unit, an open loop or closed loop feedback to monitor and verify plasma status.

To achieve these and other advantages and in accordance with the purpose of the present disclosure, as embodied and broadly described here, there may include a microwave plasma system, inductive coupled plasma system, parallel plates capacitive coupling plasma system, direct Arc jet system and atmospheric plasma system.

The foregoing and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 2A shows a plasma cloud that needs to be modified. FIG. 2B shows a plasma cloud being modified. FIG. 2C shows a modified plasma cloud.

FIG. 3A shows a tilted (asymmetric) plasma cloud that needs to be adjusted. FIG. 3B shows a plasma cloud being adjusted. FIG. 3C shows a final plasma cloud.

FIG. 4A shows a plasma cloud that needs to be adjusted. FIG. 4B shows a plasma being adjusted. FIG. 4C shows a final adjusted plasma.

DETAILED DESCRIPTION OF THE EMBODIMENTS

The present invention discloses systems and methods to modify a plasma, which may include devices disposed in a vicinity of the plasma to change a characteristic of the plasma, such as to change the temperature distribution of the plasma, to change plasma density distribution, to change the localization of the plasma chemistry, or to change the coverage of the plasma. Such in-situ tunings are beneficial for numerous plasma applications, including material synthesis or material etching.

In this document, terms "a" and "an" are used to include one or more than one. The term "or" is used for non-exclusive purpose. For example, "B or C" includes "B but not C", "C but not B" and "B and C", unless otherwise indicated. Components of embodiments of the present disclosure may be positioned in different orientations, the directional definitions, such as "left", "right", "side", "top", "bottom" etc., are used with reference to the orientation of the figure(s) being described. These definitions may be used for description purposes only, not intended to limit or restriction.

Figure 1:
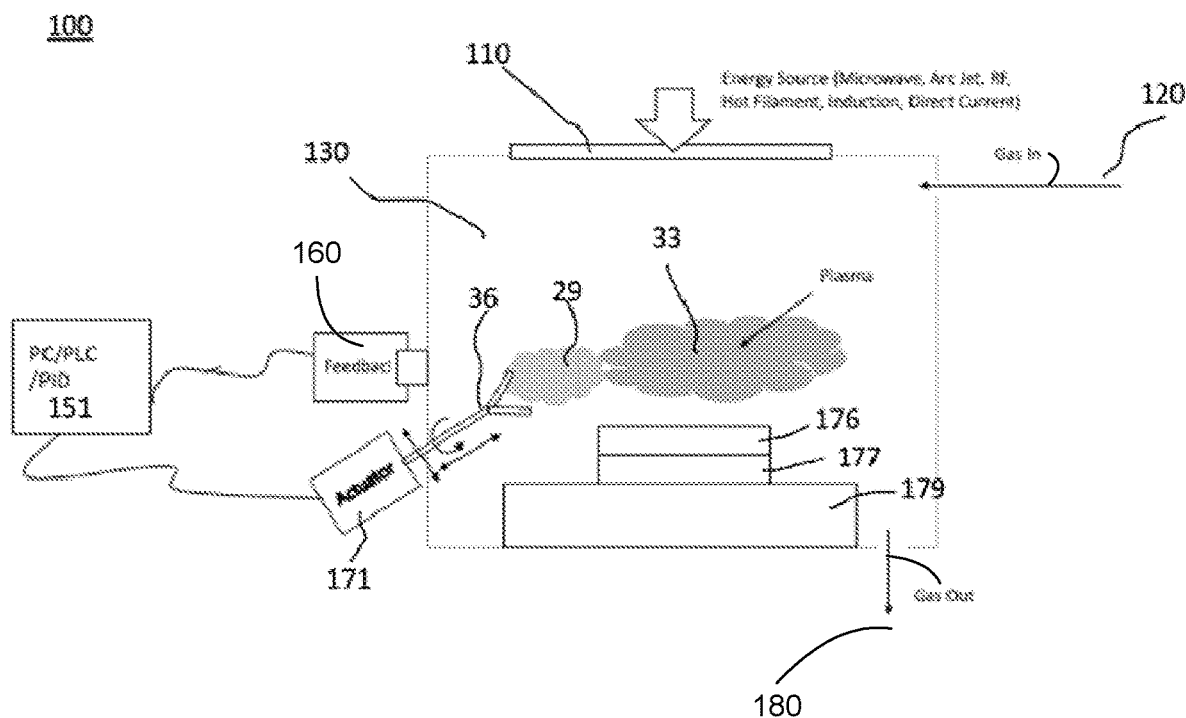
FIG. 1 is a schematic view of a universal plasma system with a feedback mechanism connected to a plasma modification device according to an aspect of the present disclosure.

FIG. 1 is a schematic view of a plasma system 100 with plasma modification functions. The plasma system 100 may include a chamber 130 with a gas inlet structure 120, and a pressure control/gas exhaust system 180. Chamber 130 can be made out of a number of materials, including stainless steel, aluminum, copper, silicon oxide, ceramics, surface oxide metal (steel, aluminum or copper), or metal coated with glass or ceramic materials, or a combination of above lists. A form of energy is brought into the chamber through the energy coupling component 110. Such energy may generate high intensity electrical, or magnetic field, or high heat inside the chamber 130, so as to ionize the gas atom brought in by 120, and generate a plasma 33. A stage 179 is placed inside the chamber 130 to define part of boundary condition of the chamber 130. A stage 179 is also utilized to support a substrate holder 177, where a substrate 176 is placed. 176 may be placed within a recess in 177, or 176 may be adhered to 177 through glue or other type of metal brazing bonding. Substrate 176 and substrate holder 177 may be inside a plasma 33, or in the vicinity of a plasma 33 or outside the vicinity of a plasma 33. A plasma characterization measurement tool 160 is continuously monitoring the status of the plasma 33. Characteristics are listed in Table 1, data are recorded and processed by a PC/PLC/PD 151. If it is determined that a listed plasma characteristic needs to be adjusted, an actuator 171 is activated and device 36 may be adjusted. Secondary plasma 29 is generated on the device. The selection/location/movement of the device 36 may modify the plasma 33 in a way to benefit the overall plasma operation.

TABLE 1

| Characteristics | Measurement method | Recorded Data |
| --- | --- | --- |
| Plasma dimension | Optical Camera | Physical dimension of discharged area |
| Plasma uniformity | Optical camera & Optical Emission Spectroscope (OES) | Intensity of light emitted from the plasma, or featured optical intensity of gas species observed by OES (i.e. C2 Swan band at 516.32 nm) |
| Power Density | 3D optical camera, OES, Langmuir probe, ball-pen probe | Incident power divided by volume of discharge |
| Gas chemistry | OES | Light emission intensity for reactant species |
| Plasma temperature uniformity | Optical camera, direct, indirect contact thermo couple or pyrometer | Temperature reading from plasma covered area |
| Substrate temperature distribution | Optical camera, direct, indirect contact thermo couple or pyrometer | Temperature measured from substrate |

Some aspects of the present disclosure include a system, composed of a pressure-controlled chamber, a gas distribution component, a substrate holder, substrates that may be affixed to the surface of the substrate holder, a gas exhaust component, an energy coupling configuration, a device for tuning a plasma, a movement mechanism coupled to the device, a feedback mechanism coupled to read plasma status, and an CPU to process and compare plasma status and issue device motion commands.

A pressure-controlled chamber: a chamber wherein a vacuum state can be achieved by removing residual gas or air from the chamber using vacuum pumps. Base vacuum can be from 10 torr to 10-9 torr. In the chamber, gas(es) can be injected and exhausted in a controlled manner to obtain stable gas pressure. The pressure can vary from 1 millitorr to 760 Torr. Chamber may define overall boundary condition for a plasma and it may facilitate plasma formation and sustain a plasma.

A substrate holder may be used to hold substrate or substrates. It may define part of the plasma boundary condition and it may have a variety of properties. It may be heated, water-cooled or thermally floated without no heating or cooling functions. Substrate holder may also be subjected to its own movement, which may include rotating along an axis, moving up/down and tilting. Substrate holder may need to withstand high temperature, along with high dose of electron/ion bombardments. A substrate holder may be insulator, or conductor for electrical biasing. A substrate holder may come in different shapes, including cylinder, round plate, a flat round plate with engineered recess, a ring, a rectangular, a donut, a sphere, and a hemisphere etc.

A gas distribution component is a component through which process gases are injected into a chamber. It may be in a shape of a gas ring with evenly distributed openings to pass gas, a shower head, or multiple gas tubes that directly bring the gas into a chamber. In some cases, different types of gases can be blended/mixed within a gas distribution component before being injected into a chamber.

A gas exhaust component is a component used for removing residue gases before, after or during a plasma process. It requires one or more openings inside a chamber and external vacuum pump. Based on the pressure reading and the gas flow rates, a throttle valve may be operated within a gas exhaust component to achieve a steady gas pressure for plasma operation.

An energy coupling configuration is a configuration to introduce external energy into a chamber. Multiple types of energies may be utilized. A plasma can be formed by passage of electric current through a gaseous media; A plasma can be formed by connecting two electrodes to a power supply and create intensive electrical field in between. Electromagnetic induction may also be applied to form a plasma. Microwave can be introduced to a microwave resonator to create high electrical fields nods within gaseous media to generate a plasma. Microwave energy can also be applied through microwave array device to generate a plasma. A well stabilized thermal electric arc discharge can produce high density by low temperature plasma through cascaded arc plasma discharge process.

A plasma is an energetic mixture of electron, ion, atom, molecule and gas species. It is the results of the interaction between high intensity electrical field and gaseous media. It may have basic spherical or cylindrical symmetric shape and may also have a shape of a hemisphere, a sphere, a disc, a ring, a donut, a cylinder, a plane or a tube. The size of a plasma can be from ⅛" in diameter to up to 36" in diameter, the height of the plasma can be from 1" to 36" within the scope of this invention. The dimension of a plasma may depend on gas pressure and amount of energy applied. A plasma density is the amount of energy in Watts, divided by the volume of a plasma, and it can be from 100 $W/m^3$ to $7 \times 10^5$ $W/m^3$ within the scope of this invention. Plasma symmetry is an important characteristic, which can be affected by the symmetry of chamber design, gas flow pattern, interaction mechanism between energy and gas, environment change during a plasma process, such as appearance of by-products or removal/etching of substrate materials. In most cases, there is a reduction of electrical field from plasma's center to its edge, therefore plasma density is not entirely uniform. This is especially true at higher power density region, such as microwave plasma process.

Dimension of device in this disclosure is related to the size of the plasma. The device is between 1% to 100% of the plasma size. It is more preferable to be less than 1% of the plasma size. In some case, the device can be between 100% and 500% of the plasma size. Ceramic materials including fused silica, aluminum oxide, silicon carbide etc., and refractory metals including tungsten, molybdenum, titanium, tantalum, palladium can be selected for making the device, especially for the portion where the device has direct contact with the plasma. The device can be water cooled or contain a heating element. And the device can be hollow so that additional gas can be directly injected into or removed out of specific area of the plasma.

Device is driven by a movement mechanism, wherein the movement mechanism is configured to change a position, an exposed dimension, a momentary, intermittent or continuous rotation or spinning, an expanding or shrinking, or an orientation of the device relative to a plasma. A linear actuator, a rotational actuator, or combination of two or more actuators can be selected to apply certain movement to the device. Motion mechanism can be installed inside or outside the chamber. Motion may include one or more movements of extending, retracting, rotation around the axis of a device or rotation around other point. In one embodiment, a device may be retracted to a point by linear motor, then second motor drive the device to rotate around a point.

A feedback mechanism may be built into the system. It can be either open loop or closed loop mechanism, wherein closed loop mechanism considers current plasma conditions and alter the device to the desired condition. In open loop mechanism, device acts completely on input basis. Measurement tools may be used to read plasma status, these tools may include a CCD camera, an Optical Emission Spectrometer for visible and invisible emission, a Langmuir probe, a Ball-pen probe, a magnetic (B-dot) probe, an Energy analyzer, a thermocouple, an infrared optical pyrometer, a Proton radiography, an absorption spectrometer, a beam emission spectrometer, a laser-induced fluorescence, an electron cyclotron emission detector. Parameters of a plasma listed in Table 1 may be obtained and sent to a central process unit (CPU/PLC). A comparison can be made between current measurement and desired parameters. Commands then can be sent from the CPU/PLC to actuate a device. Control algorithm may include PID control, Logic Control, On-Off control, Proportional control etc.

Process gases may be flowed into the chamber by a gas distribution component and removed by a gas exhaust system. Gas flow pattern may be designed to match chamber geometry. In one embodiment, a gas shower is located in the central top region of a chamber to create an overall uniform "gas shower" pattern, in another embodiment, a gas ring is located along side wall of a cylindrical chamber so that flowing gases follow the pattern of the interior geometry and balance near the center of a chamber.

External energy is required to form a plasma. In one embodiment, the energy is in the form of microwave. In another embodiment, the energy is in the form of electrical field or magnetic field, or combination of both. In additional embodiment, the energy is a combination of microwave and electrical/magnetic fields. At low gas pressure (from millitorr to 10-20 Torr), when external energy applied to gas inside the chamber is high enough, outmost electron(s) will be stripped off gaseous molecules, and form ions. The combination of electrons, molecules, atoms and ions form a mixture of species and induce collective behavior under the influence of external electric or magnetetic field. In order to sustain plasma at different levels of gas pressure, coupled energy power level, gas flow rates, etc. need to be adjusted so that gaseous species can further interact among each other to continue the plasma. These parameters may be modified to generate plasma with specific properties and applications.

Figure 2A:
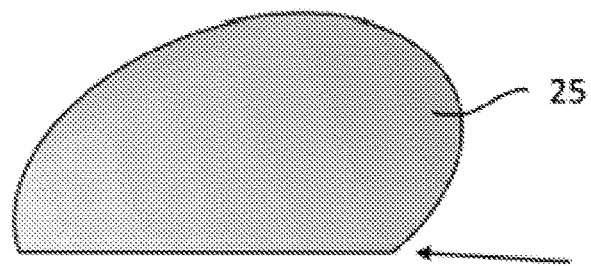
FIGS. 2A-2C show first example of a plasma modification by a rotatable device in the shape of "Y" that is inserted from one side of a plasma.
Figure 2B:
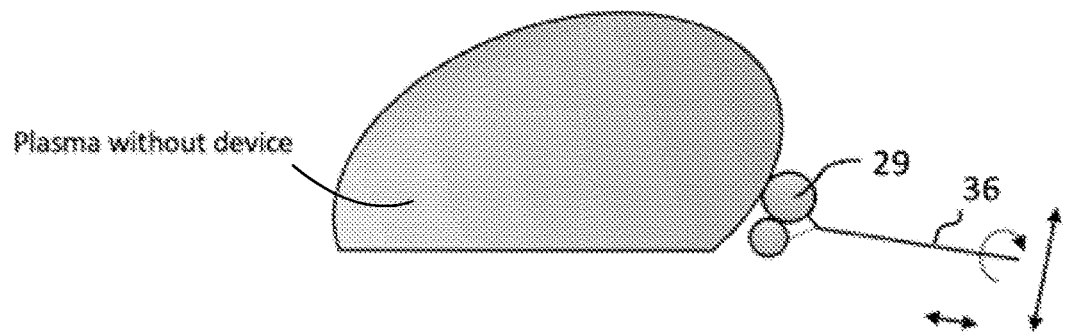
Figure 2C:
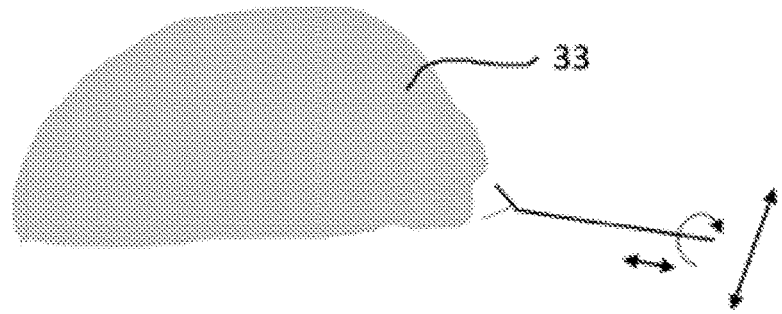

Ununiform plasma is a common issue, as shown in FIGS. 2A-2C. An uneven plasma 25 is displayed in FIG. 2A, and the plasma density in one direction is stronger than the opposite direction and therefore the plasma is "tilted". In current disclosure, there are a number of ways to correct this type of plasma. In one embodiment (FIG. 2B), a device in the shape of "Y" 36 is inserted into the vicinity of the plasma with lower plasma density. The perturbation of the device 36 generates secondary plasma 29 around the device 36, especially around the tips of the device. FIG. 3C shows a result where the overall plasma 33 is improved.

Figure 3A:
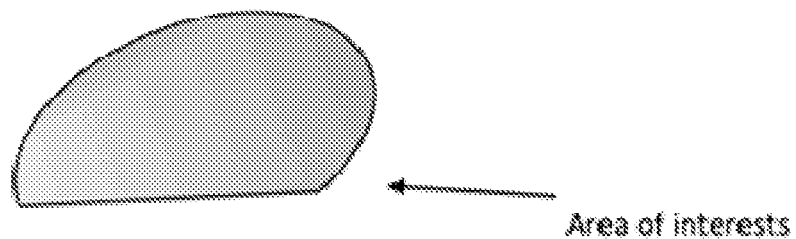
FIGS. 3A-3C show second example of a plasma modification by a rotational device that is inserted from underneath a plasma.
Figure 3B:
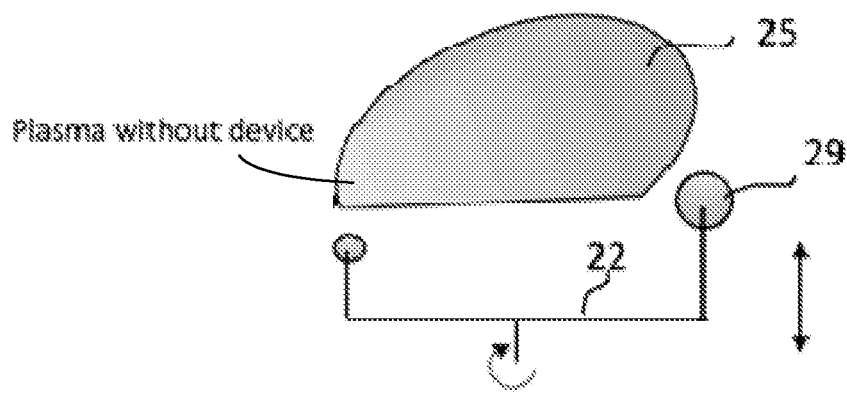
Figure 3C:
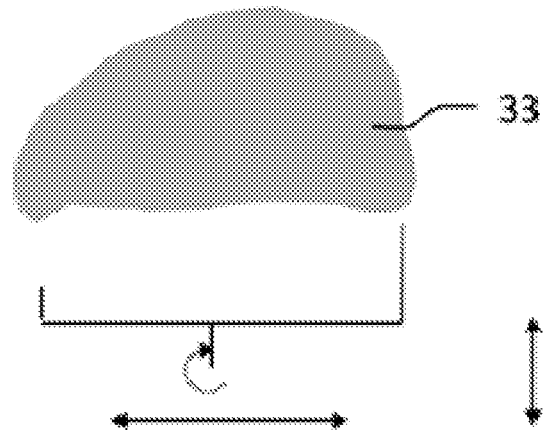

FIGS. 3A-3C demonstrate another way to modify the same type of plasma 25 in FIG. 2, but using a different type of device 22, a device in the shape of a seesaw with different pins at both end, is placed underneath the plasma, where a longer pin is further extended into the plasma to create intense secondary plasma 29 in that particular region. The overall improved plasma 33 is shown in FIG. 3C. In addition, a continuous rotation of the device can create a secondary plasma 29 in the shape of donut to fully balance the plasma.

Figure 4A:
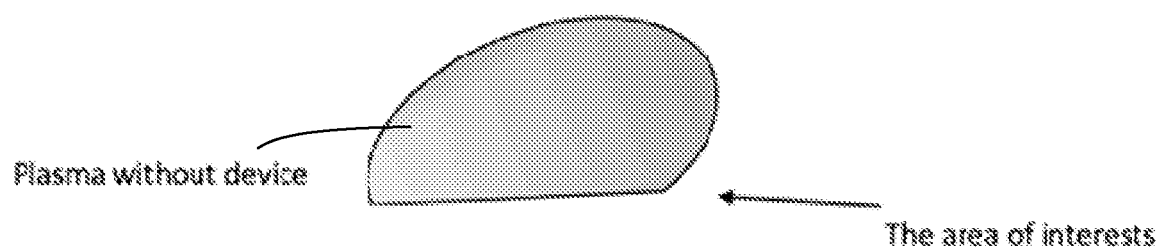
FIGS. 4A-4C show third example of a plasma modification by a rotatable device in the shape of a lollipop that is inserted from one side of a plasma.
Figure 4B:
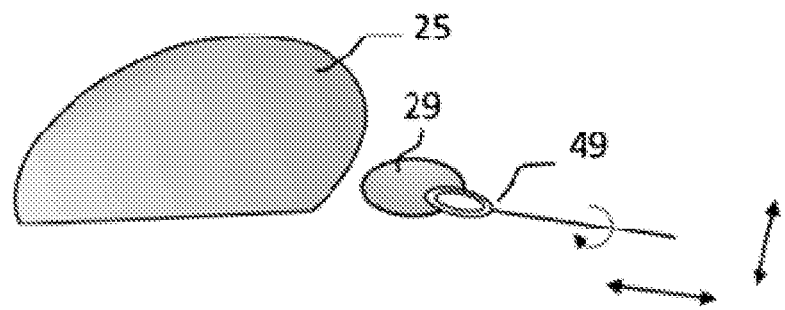
Figure 4C:
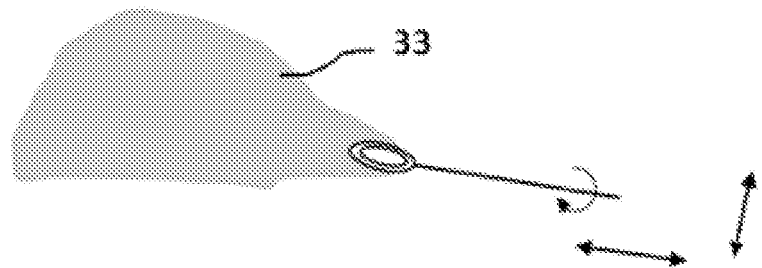

FIGS. 4A-4C show another embodiment where same type adjustment as in FIG. 1 is applied to the plasma 25, but using a device in the shape of a donut 49. A more flattened secondary plasma 29 around the tip of the device is obtained. As a result, overall plasma 33 is balanced with slightly different overall plasma shape is shown in FIG. 4C.

Figure 5A:
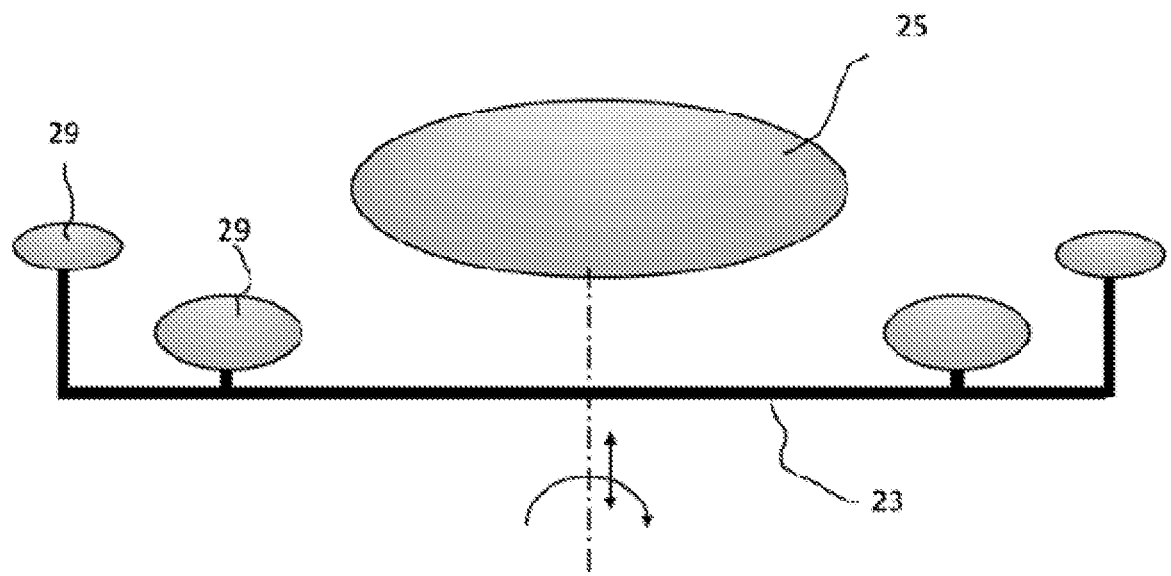
FIGS. 5A-5B demonstrate a way to create an extended plasma coverage using a device.
Figure 5B:
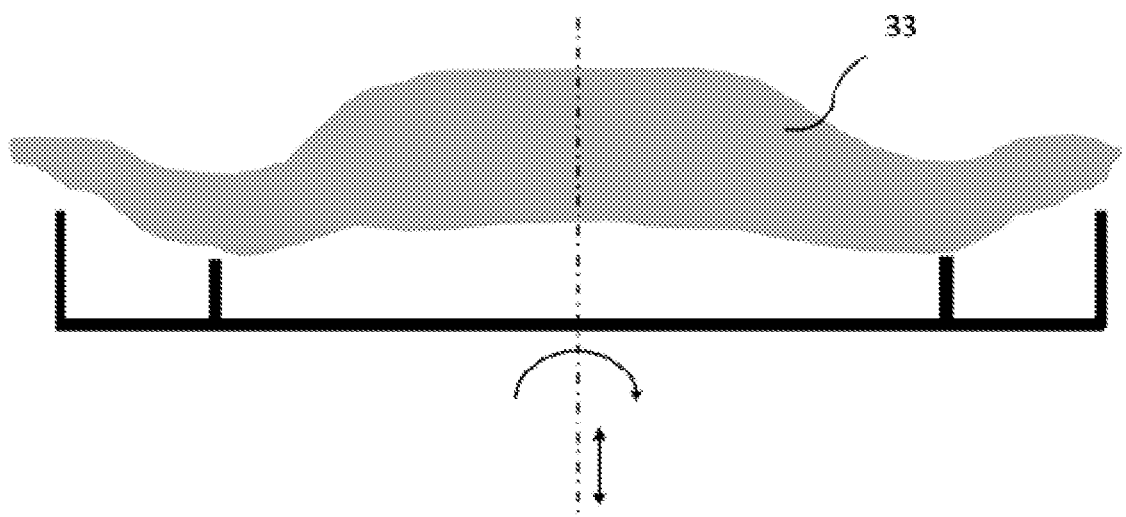

In some embodiment, plasma can be enhanced or enlarged by applying a device. FIGS. 5A-5B show an example of a spherical plasma 25. When device 23 in the shape of double concentric rings is inserted into the plasma, two plasma rings are created in FIG. 5A. Additional rotational motion can further enhance this result. Overall plasma 33 is enlarged, as shown in FIG. 5B. In one embodiment, an object in the shape of a rod can be selected for a cylindrical plasma. In another embodiment, an object in the shape of a ring can be selected for a donut shape plasma.

In one embodiment, in a plasma assisted material synthesis process, while grown material is getting thicker, by-product may also grow on nearby substance, including chamber walls, substrate holders, or on substrate itself. Such by-product formation may eventually alter chamber conditions and change the characteristics of the plasma. In one embodiment using microwave plasma for material synthesis, by-product will eventually absorb majority of the microwave energy and form direct arcing, which will forcibly terminate the synthesis. Similar scenario may be found in a plasma etching process, where loosing too much material may alter plasma boundary condition. Plasma tuning device and method in this disclosure may also be utilized to either interact with by-product in a synthesis process or compensate with removed material in an etching process, in order to restore a stable plasma and further extend plasma process.

Figure 6:
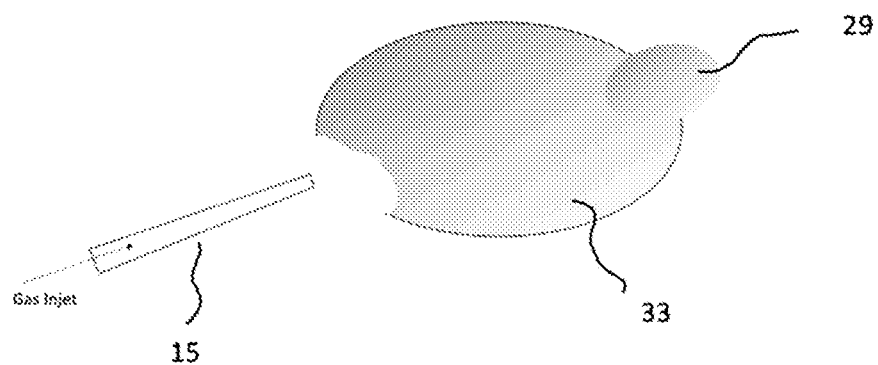
FIG. 6 demonstrates a way to adjust plasma by a gas delivering device in the shape of hollow tube.
Figure 7:
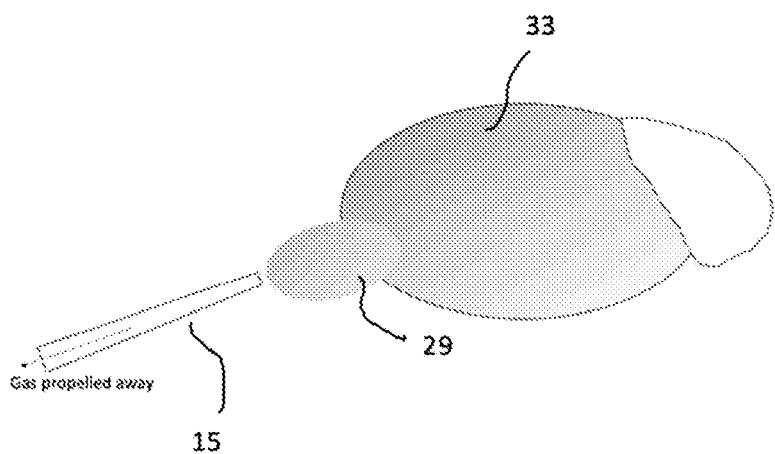
FIG. 7 demonstrates a way to adjust plasma by a hollow tube device inserted into the plasma vicinity and pumps gas from a plasma.
Figure 8:
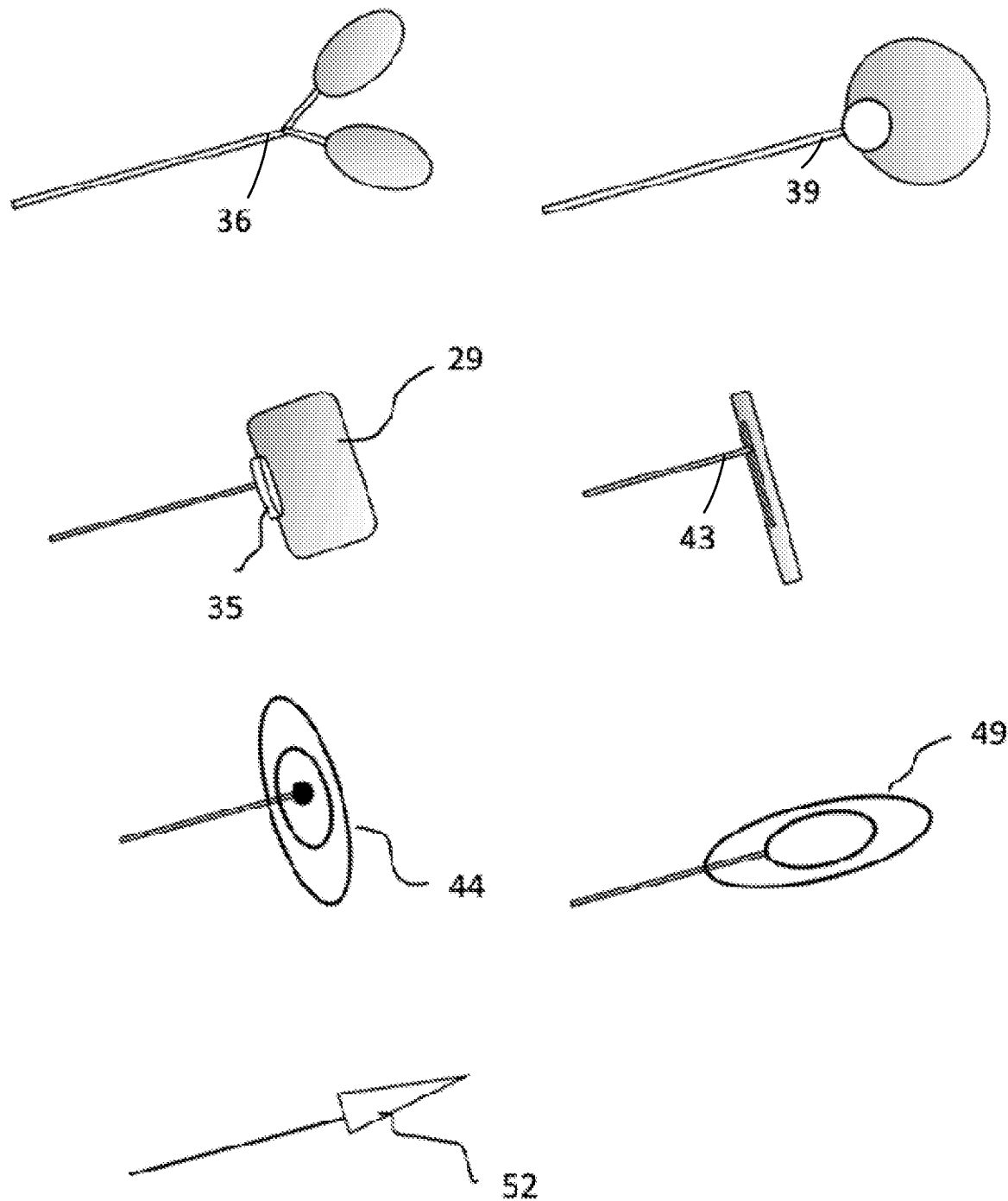
FIG. 8 demonstrates perspective views of devices in different shaped and how some of them generate secondary plasma.

A variety of devices may be used to selectively modify plasma characteristics listed in Table 1. In one embodiment, a device in the shape of a rod can be used for a cylindrical plasma. In another embodiment, a device in the shape of a plate can be selected for a sheet plasma. In one example, as demonstrated in FIG. 6, new reactant gases may be transferred directly into the targeted area by device 15. Overall plasma 33 shape is modified by the secondary plasma 29. In addition, specific reactant gases may be delivered by the tube to certain area in order to facilitate the plasma reaction in that area. In one embodiment, an inert gas may be delivered by the tube to the said area in order to minimize the reaction rate in the area. FIG. 7 also demonstrates a tube device 15 being inserted into a plasma cloud. In this example, a vacuum (or a lower differential pressure) is maintained on the opposite side of the tube so that gas is directly propelled away from tube insertion area. As a result, the plasma density on the opposite side of the tube insertion area is reduced. By adjusting the gas propelling rate via the tube, plasma chemistry at this area may be adjusted, along with modified overall plasma shape 33. As described above, the shape of devices that interact with plasma need to be designed to match plasma types. A number of devices are demonstrated in FIG. 8, 35 is a disc device, 36 has two probes, 39 is a spherical device, 43 is 90 degree bent probe, 44 and 49 are donut shape with different orientation, and 52 is spear shape device. Additional features such as hollow interior can also be built-in these devices to inject or remove gases.

Figure 9:
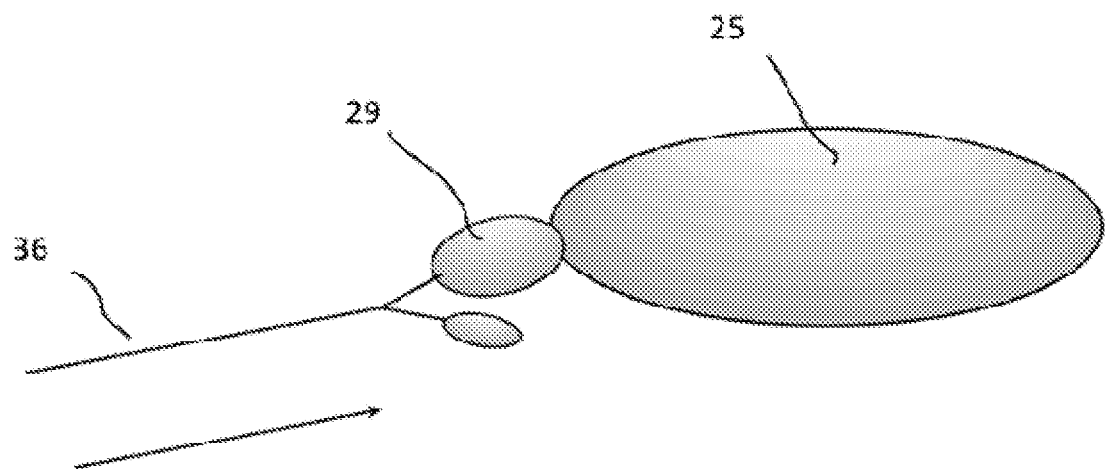
FIG. 9 demonstrates plasma modification when a device is extended into a plasma.
Figure 10:
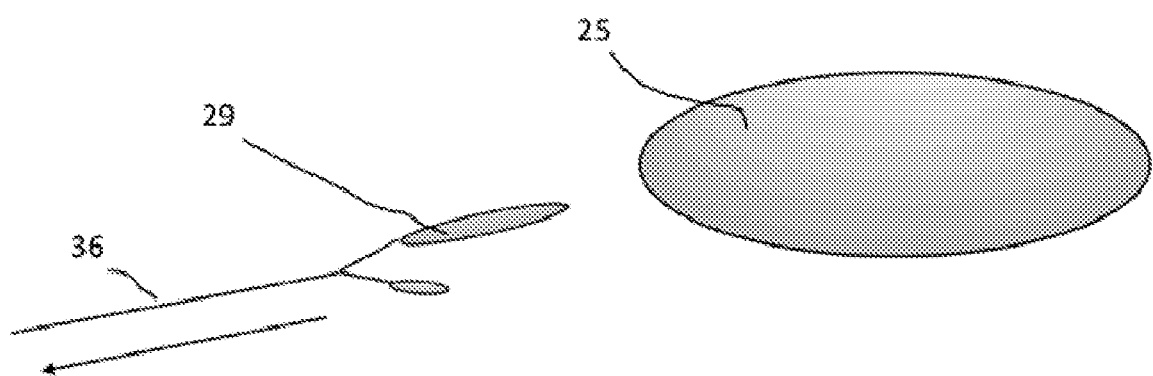
FIG. 10 demonstrate plasma alteration when device in FIG. 9 is retracted away from a plasma.
Figure 11:
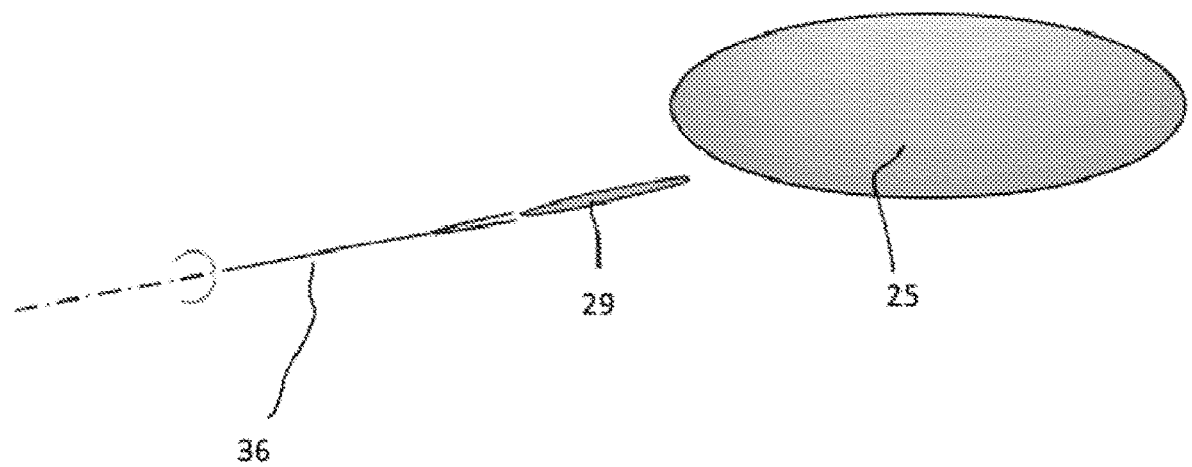
FIG. 11 demonstrate plasma alteration when device in FIG. 9 is rotated around its own axis.
Figure 12:
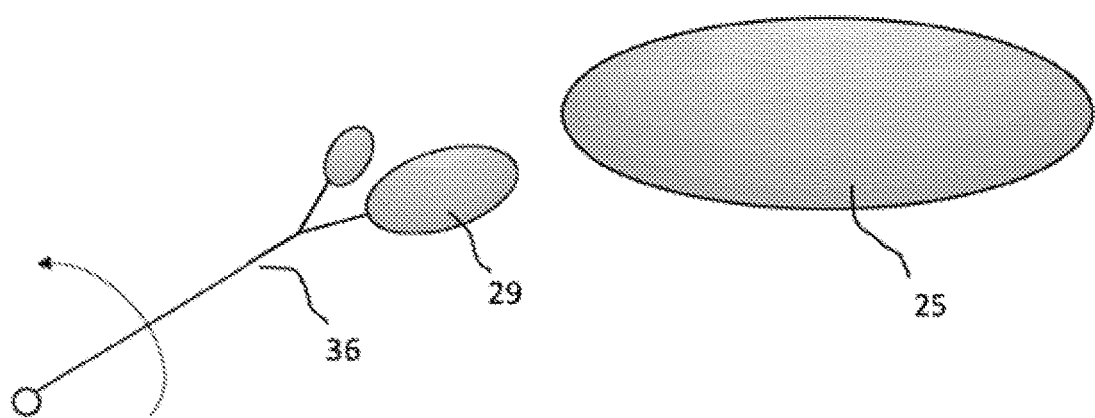
FIG. 12 demonstrate plasma alteration when device in FIG. 9 is rotated around a point.

Position and orientation of devices are also important for the current disclosure. FIG. 9 demonstrates secondary plasma 29 start to increase on a device 36 when it is extended into a plasma 25. FIG. 10 shows that secondary plasma 29 decreases when the device 36 is moving away from the plasma. In one embodiment, as shown in FIG. 11, when the device 36 rotates along its own axis, shape and location of secondary plasma 29 are altered. FIG. 12 shows that the device can also rotate along a point to create different plasma pattern and to interact with other objects inside the plasma chamber.

Figure 13:
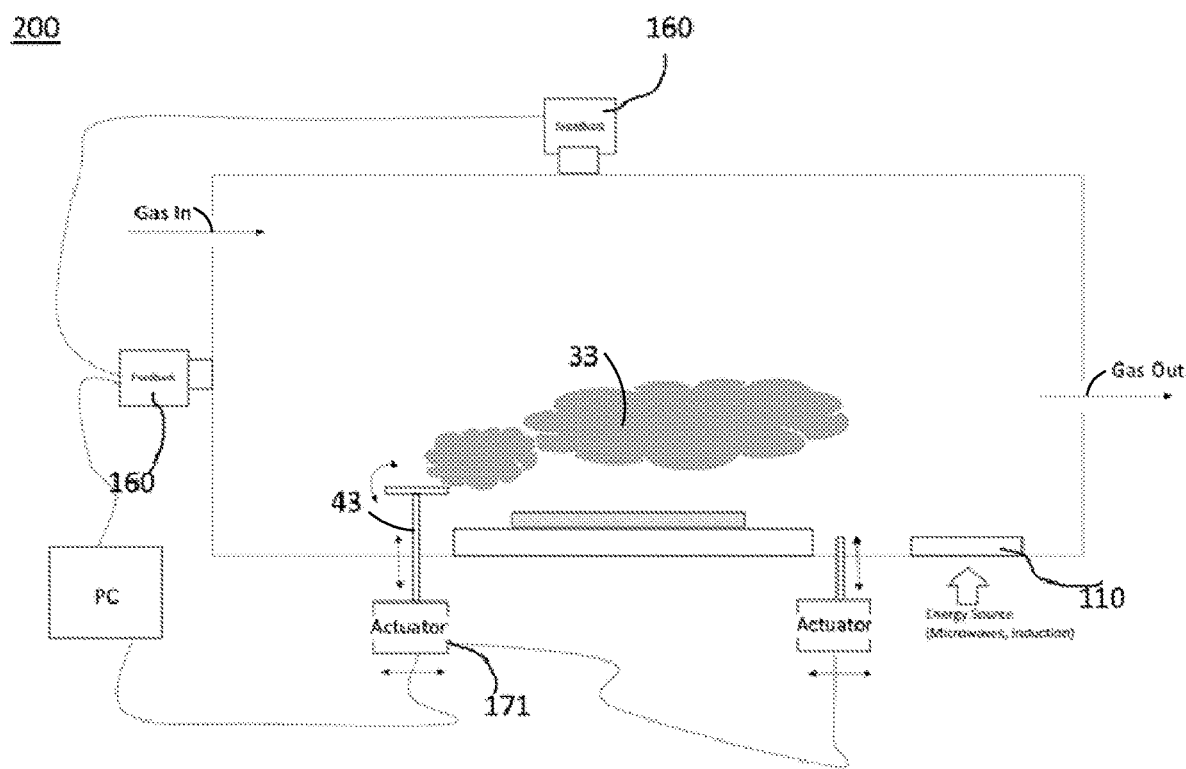
FIG. 13 is a schematic view of a microwave assisted plasma chamber system in the present disclosure.

FIG. 13 shows the method utilized in a plasma enhanced microwave reactor 200. Microwave energy is coupled through an energy entry 110, typically a microwave window. A linear device with a 90 degree bend 43 disposed within the vicinity of a plasma creates secondary plasma around the device on one side of the graph and creates an overall uniform plasma 33. Plasma detection tools 160 are utilized to detect plasma 33 condition. A PC drives the actuator 171 to adjust the position of the device 43, and to interact with the plasma 33.

Figure 14:
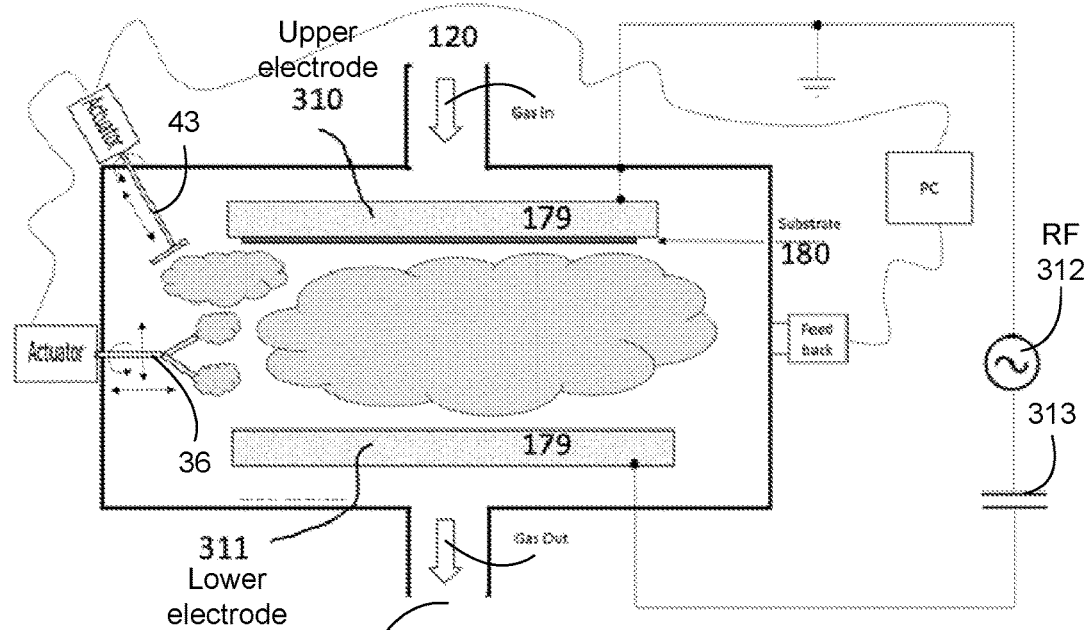
FIG. 14 is a schematic view of a capacitively coupled plasma chamber system in the present disclosure.

FIG. 14 shows the method utilized in a capacitively coupled plasma reactor 300. Two electrodes 310 and 311 are used to generate high electrical field in between. One, or both of the electrodes can also be used as a stage, or a substrate holder 179 to hold a substrate 180. Gas inlet component 120 and gas exhaust/pressure adjustment component 180 can sustain a stable gas pressure within the chamber. More than one device may be used in 300 at the same time. An external RF power supply 312 is applied RF energy across two electrodes with a matching capacitor 313. In the case of a direct current, 312 may be considered as a power supply with zero HZ RF frequency, and 313 is therefore eliminated.

Figure 15:
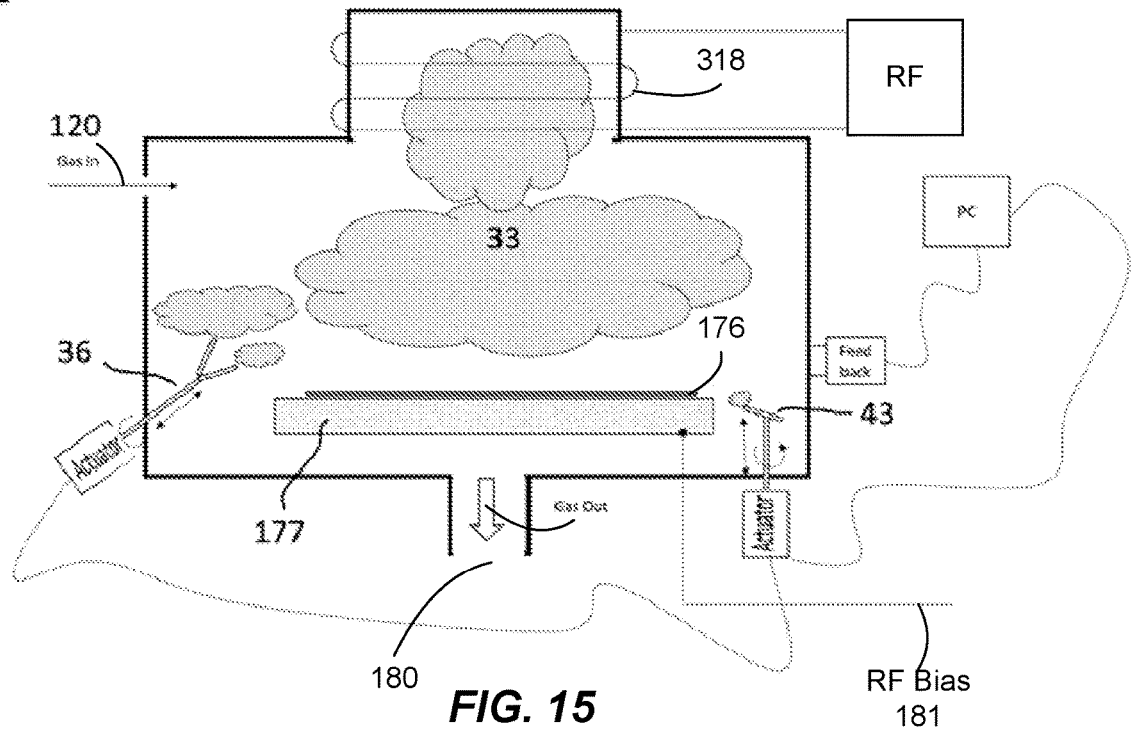
FIG. 15 is a schematic view of a Radio Frequency (RF) inductive plasma chamber system in the present disclosure.

FIG. 15 shows the method utilized in a radio frequency (RF) inductive plasma chamber 400. A coil 318 is utilized to accommodate RF energy for plasma formation. Device 36 is able to shift the overall plasma 33 to one side and to make uniform plasma coverage on substrate 176. A RF bias voltage 181 can be also applied to the substrate holder 177 to improve material synthesis or etching.

Figure 16:
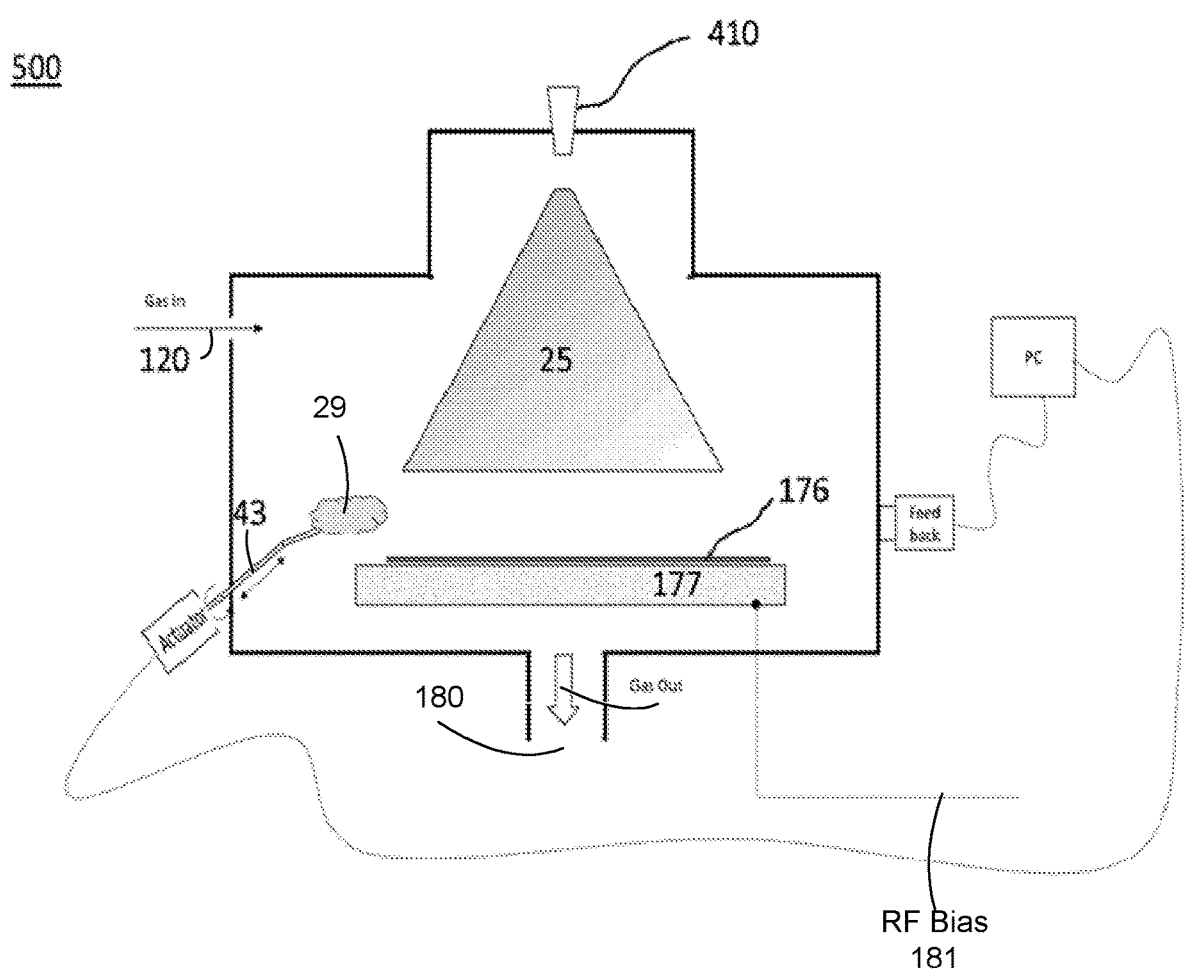
FIG. 16 is a schematic view of a plasma spray chamber system in the present disclosure.

FIG. 16 shows the method utilized in a plasma jet chamber 500. A plasma nozzle 410 is used to inject plasma into a chamber. Device 43 may be used to improve or enhance plasma 25 in certain area. In addition, this disclosure can also be applied to atmospheric plasma, wherein a pressure-controlled chamber might not be necessarily needed.

Figure 17:
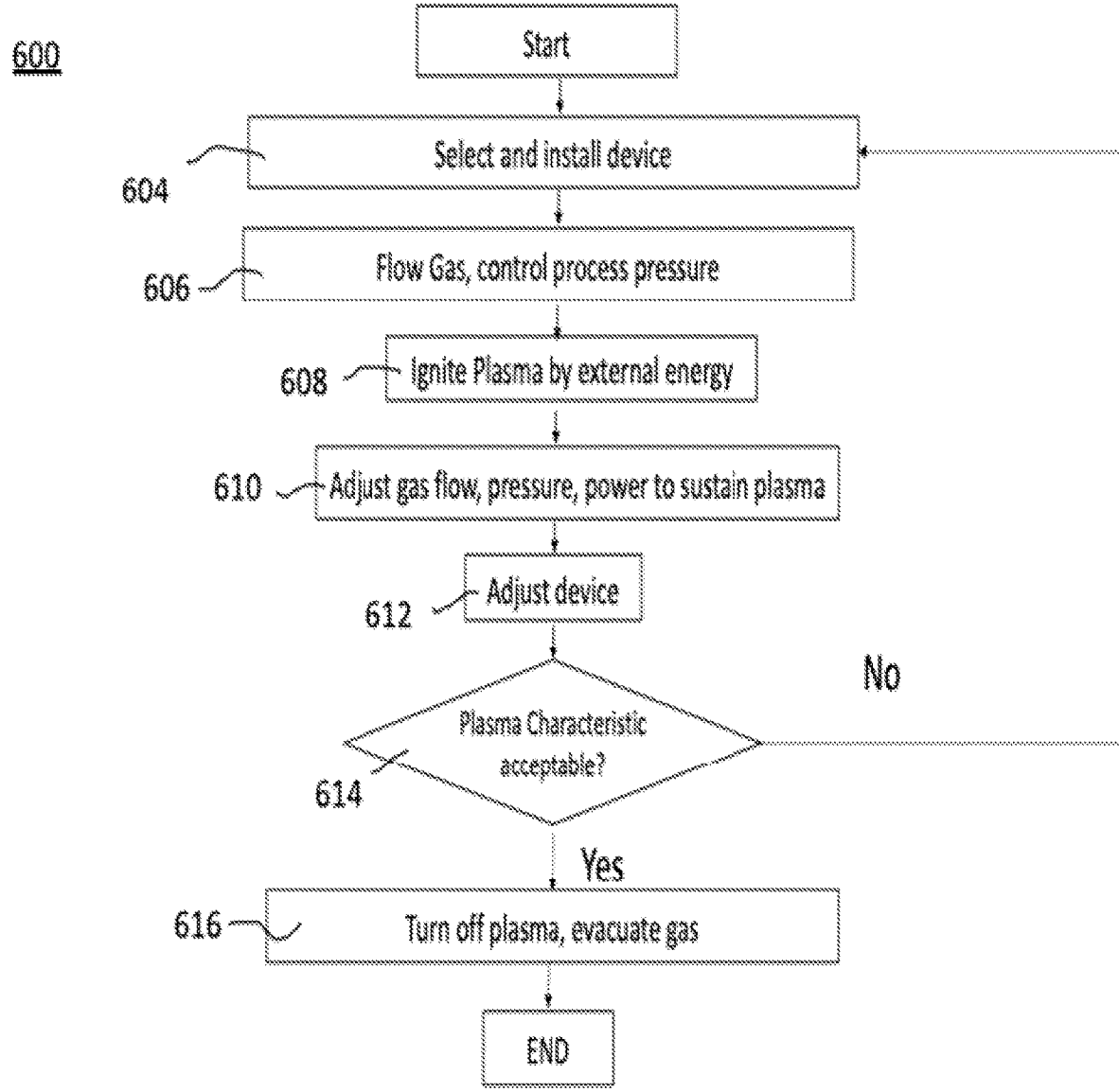
FIG. 17 illustrates a flow chart of a method for performing selection of a device to modify a plasma, in accordance with some embodiments of the present disclosure.

FIG. 17 illustrates a flow chart of a method for performing selection of a device to modify a plasma, in accordance with some embodiments of the present disclosure. The steps of method 600 may be performed by various computer programs, models, or any combination thereof, configured to perform selection of the device. Method 600 may begin at step 604 where devices with actuator were selected and installed inside a plasma chamber. Selection criteria rely on design of the device with respect to the plasma characteristics. It may involve with plasma modeling, heat transfer, or gas delivery studies. In step 606, gases are flowed into a chamber with pre-pulled vacuum and chamber pressure is adjusted by using gas exhaust components. The chamber may reach a pressure ideal for plasma ignition. Step 608 illustrates a plasma is ignited by an external energy. In step 610, plasma may require additional adjustments in order to get the plasma to desired state. Such adjustments may include gas flow rates adjustment, adding or stopping additional gas, modifying the chamber pressure, or changing the incident power. In step 612, device may be disposed into the plasma chamber or into a vicinity of the plasma. Actuators may be used to modify the characteristic of the plasma, i.e., the coverage of the plasma. In step 614, the system may determine if plasma is modified to the desired level. For example, whether the overall plasma coverage is extended and to cover all area of substrate in the substrate holder; whether the plasma gas chemistry is modified at certain area; whether temperature distribution is even across the entire substrate; whether the device is able to reach to all locations within the chamber to interact with any possible buildup or residue, etc. If desired plasma state is not achievable, method 600 may return to step 604 to apply another device into this plasma chamber; otherwise, method 600 may proceed to step 616. In step 616, the plasma may be turned off by deactivating the energy source(s). All residual gases are removed by vacuum pump. The chamber may be brought back to atmospheric pressure.

Figure 18:
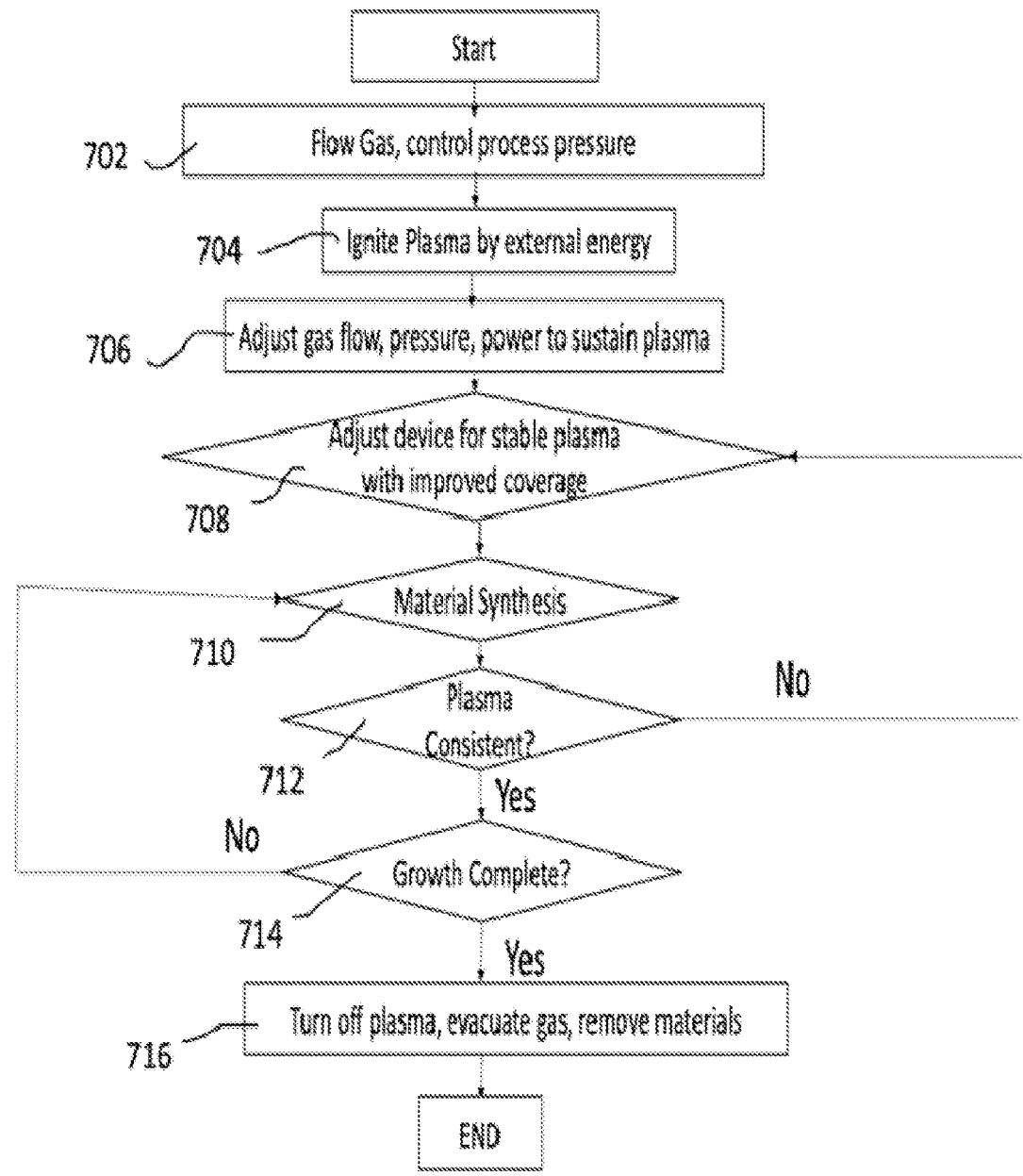
FIG. 18 illustrates a flow chart of a method for modifying a plasma, in a system wherein a plasma modification device is selected through the steps in FIG. 17, in accordance with some embodiments of the present disclosure.

FIG. 18 illustrates a flow chart of a method for modifying a plasma, in a system wherein a plasma modification device is selected through the steps in FIG. 17, in accordance with some embodiments of the present disclosure. The steps of method 700 may be performed by various computer programs, models, or any combination thereof, configured to operate the device. It may be installed and applied to any part of the chamber, and interact with plasma from all direction, such as top, bottom, or side of the plasma, depending on the reference surface of the plasma that will be used for its applications (synthesis, etching, or others). The device itself may also be an energy coupling component through which additional energy such as biased voltage and high-velocity ions may be brought into the chamber.

Method 700 may begin at step 702 where an optimized gas pressure for easy plasma ignitions is obtained. In step 704, Plasma is ignited, as described in previous embodiments. In step 706, plasma is then further adjusted to reach process conditions. In step 708, system may move the device through actuator to modify the plasma. The movement may be applied by the computer controlled automated process or applied by hand. In some embodiments, there may not be any adjustment at the early stage of a plasma. In step 710, system may start its process, for example, to synthesize silicon oxide from silicon precursor gasses like dichlorosilane or silane and oxygen precursors at a pressure from a few millitorr to a few torr; to synthesize silicon nitride, formed from silane and ammonia or nitrogen at pressure from a few torr to tens of torr; to synthesize single crystal, polycrystalline diamond or DLC (diamond like material), formed from hydrogen, carbon bearing gases such as methane or methanol, oxygen bearing gases such as methanol, acetone, carbon monoxide or carbon dioxide, or nitrogen bearing gases such as nitrogen or ammonia, at pressure from a few torr to atmospheric pressure, preferably at a pressure from a few torr to 300 Torr; more preferably at a pressure from 50 Torr to 200 Torr; and more preferably at a pressure from 50 to 100 Torr, or more preferable at a pressure from 100 Torr to 200 Torr. The system may also be used to etching purpose, for example, it may remove silicon oxide layer in a designed pattern at certain depth; It may also be used to producing designed pattern in other materials, including silicon, diamond, aluminum oxide, among other materials. Hydrogen, chlorine, fluorine or oxygen may be involved for the etching purpose.

In step 712, the system may monitor the status of plasma by a feedback mechanism, which furnishes the computer system with plasma parameters such as coverage diameter, uniformity status, power density distribution, or gas chemistry status. The uniformity status of the plasma may be obtained by mapping substrate temperature. It may also be obtained by measuring the plasma intensity at selected locations. For example, temperature of a location may be measured and recorded. Temperature measure on this location may be sampled over time and compared with the original temperature reading to determine if plasma loses its uniformity. In one embodiment, an OES (optical emission spectrometer) may point to a plasma, and measure selected gas specie intensity (i.e., hydrogen Ha peak at 656 nm, C2 peak at 514 nm, etc.). An intensity trend analysis with respect to time may determine if the plasma needs to be adjusted. The comparison portion of the calculation is done in step 712, by means of a PC or PLC. If it is determined by PC the plasma needs to be modified, method 700 may return to step 708 for adjustment. It may be determined that no plasma adjustment is necessary, and process keeps running. Until either the process is finished to go to step 716, or a modification is needed, therein the method 700 will return to step 708. In step 716, the plasma chamber is turned off, all gases may be stopped and residual gases may be evacuated from the chamber and brought back to atmospheric condition so as to open the chamber and remove the final products.

Embodiments disclosed herein include:
A. A system for producing plasma created product including a pressure adjustable chamber, a stage, a substrate holder, a substrate, an energy coupling mechanism, an actuated device that may be disposed into vicinity of a plasma to modify characteristics of the plasma, a feedback reading mechanism, a closed loop or open loop PC/PLC/PID structure to drive the actuator, a gas distribution component, an exhaust/pressure adjustment component.
B. A method for adjusting the plasma by: detecting the plasma characteristics in a pressure-controlled chamber, using the actuator to drive the device to modify plasma characteristics, obtaining better plasma condition and improving the property of the final product created by the plasma.
C. A non-transitory machine-readable medium comprising instructions stored therein, the instruction executable by one or more processors to facilitate performing a method for detecting plasma characteristics, including saving and comparing plasma parameters at different time scale, calculating the movement of the device, and translating the movement into command of the actuator(s).
D. A system comprising a chamber, an energy coupling configuration coupled to the chamber, wherein the energy coupling configuration is configured to introduce energy into the chamber to form a plasma; a device coupled to the chamber, wherein the device is disposed in a vicinity of the plasma and movable relative to the plasma, wherein the device is configured to modify the plasma formed by the energy coupling configuration.

In some embodiments, the system as further comprising a stage disposed inside the chamber. The stage is configured to define a part of a boundary condition of the chamber, also the stage is configured to support a substrate holder for supporting a substrate.

The system can further comprise a substrate support disposed inside the chamber, wherein the substrate support is configured to support a substrate.

In some embodiments, the system can further comprise a heated substrate support disposed inside the chamber. The heated substrate support is configured to support a substrate. The chamber is configured to form a pressure-controlled chamber.

In some embodiments, the system can further comprise a gas distribution system. Such system is configured to deliver process gases into the chamber.

The system can further comprise an evacuation system coupled to the chamber. The evacuation system is configured to evacuate gas or fluid in the chamber. Single or multiple vacuum pumps can be applied.

The system can further comprise a pressure-controlled system coupled to the chamber; such system is configured to establish a desired pressure in the chamber. Pressure control mechanism can be upstream (where the gas flow rates are regulated) or downstream (where the gas exhaust rates are regulated) mechanism.

The system can further comprise energy that is introduced by the energy coupling configuration. Such energy comprises an energy in the form of a microwave, an electric, a magnetic field, a combination of electric field and magnetic field, or a combination of a microwave and at least one of an electric field or a magnetic field.

In some embodiments, the energy introduced by the energy coupling configuration comprises at least one of a high intensity electrical or magnetic field, or a high heat inside the chamber to ionize gas atoms in the chamber to form the plasma.

In some embodiments, the energy coupling configuration comprises two electrodes forming an electric field in between to form the plasma.

In some embodiments, the energy coupling configuration may comprise an antenna forming an electromagnetic field configured to form the plasma.

In some embodiments, the energy coupling configuration comprises a microwave resonator configured to form the plasma.

The system can further comprise a device which is configured to change a characteristic or configuration of the plasma formed by the energy coupling configuration.

The device can be configured to generate a secondary plasma around or near the device, the secondary plasma can interact with the plasma and further assist in modifying the plasma.

The device can further be configured to optimize the plasma by the modification. A movement, a position or an orientation of the device can further be optimized to obtain a desired plasma characteristic or configuration.

In some embodiments, the device can be configured to be extended to or retracted from the plasma, rotated around an axis, or rotated around a point. Such axis or point can be within the device itself, near the device, or anywhere within the chamber or system.

In some embodiments, the device is configured so that the plasma characteristic or configuration is changed when the device rotates, moves to a different location or changes to a different orientation relative to the plasma.

In some embodiments, the device is configured so that the plasma characteristic or configuration is changed when the device moves to have a different exposure to the plasma.

In some embodiments, the device is configured to move continuously to modify the plasma.

In some embodiments, the device is configured to move intermittently to modify the plasma.

In some embodiments, the device is configured to rotate continuously to modify the plasma. The device can further be configured so that the plasma characteristic or configuration is changed when the rotating device moves to a different location.

The device can further be coupled to one or more actuators for moving the device.

In some embodiments, two or more actuators are coupled to the device, at least a first actuator of the two or more actuators is configured to rotate the device, and at least a second actuator of the two or more actuators is configured to move the device.

In some embodiments, the device is coupled to a linear actuator for linear motions and coupled to a rotational actuator for rotational motions.

In some embodiments, the device is coupled to one or more motors to move the device.

In some embodiments, the device is coupled to a linear motor for linear motions and coupled to a rotational motor for rotational motions.

In some embodiments, the device comprises a Y shape, a disk shape, a rod shape, a donut shape, a plate shape, a ring shape, a branch shape having a shorter branch and a longer branch, a double concentric ring shape, or a pointed shape.

In some embodiments, the device comprises a size of less than 1% of the plasma size.

In some embodiments, the device comprises a size of more than 500% of the plasma size.

In some embodiments, the device comprises a size of between 1% and 500% of the plasma size.

In some embodiments, the device comprises materials resistant to high temperature operation, it may include a ceramic material, a refractory metal, a metal, or a combination of these materials. In some embodiments, the device comprises fused silica, aluminum oxide, silicon carbide, tungsten, molybdenum, titanium, tantalum, or palladium.

In some embodiments, the device comprises a heating element within the device, or the device comprises a fluid path within the device, the fluid path may be coupled to a circulation system for device cooling.

In some embodiments, the device comprises a fluid path, and the fluid path may be coupled to a gaseous source for delivering a gas to the chamber.

In some embodiments, the device is coupled to a gaseous source for delivering a gas to an area inside of the plasma or to a vicinity of the plasma.

In some embodiments, the device comprises a fluid path, which is coupled to an evacuation system for evacuating a gas from an area inside the plasma or from a vicinity of the plasma.

In some embodiments, the device is disposed at a lower density portion of the plasma to correct an unevenness of the plasma density by generating a secondary plasma around the device, in some embodiments, at the tip of the device.

In some embodiments, the device comprises shorter and longer branches, disposed underneath the plasma, with the longer branch extended into the plasma. In some embodiments, the device is configured to rotate around an axis between the shorter and longer branches.

In some embodiments, the device comprises double concentric rings, disposed in the plasma. In some embodiments, the device is configured to rotate around an axis of the double concentric rings.

In some embodiments, the device is coupled to a reactant gas source for delivering a reactant gas into the plasma. In some embodiments, wherein the device is configured to generate a secondary plasma with the reactant gas.

In some embodiments, the device is coupled to a reactant gas source for delivering a reactant gas into an area in the chamber. In some embodiments, the device is configured to facilitate a reaction rate in the area.

In some embodiments, the device is coupled to an inactive gas source for delivering an inactive gas into an area in the chamber. In some embodiments, the device is configured to minimize a reaction rate in the area.

In some embodiments, the device is coupled to a vacuum source for evacuating an area in the plasma. In some embodiments, wherein the device is configured to lower a plasma density at the area.

In some embodiments, wherein the device is coupled to a pressure-controlled source for controlling an evacuation of an area in the plasma. In some embodiments, wherein the device is configured to control a plasma density at the area.

In some embodiments, the device is configured to modify the plasma to provide a uniform plasma over a process substrate.

In some embodiments, the device is configured to modify the plasma to provide a plasma over a wall of the chamber.

In some embodiments, the device is configured to modify the plasma to provide a plasma over an area having by-products caused by a process using the plasma.

E. The current disclosure includes a system wherein the characteristic of the plasma comprises at least one of a temperature distribution of the plasma, a localization of the plasma density, a localization of the plasma chemistry, or a coverage of a plasma.

In some embodiments, the characteristic of the plasma comprises at least one of an energy distribution, a plasma density distribution, a reaction species concentration and distribution, a temperature variation and distribution of the plasma, or a temperature variation and distribution of the plasma and surrounding objects.

In some embodiments, the system includes a plasma measurement device configured to measure at least the characteristic of the plasma. In some embodiments, the system includes a plasma characterization measurement tool for continuously monitoring the status of the plasma.

In some embodiments, the system further comprises a plasma characterization measurement tool for measuring at least one of a plasma density or a dimension of coverage of the plasma.

F. The current disclosure includes a system comprising a plasma measurement device, wherein the plasma measurement device is configured to measure an energy distribution, a plasma density distribution, a reaction species concentration and distribution, a temperature variation and distribution of the plasma, or a temperature variation and distribution of the plasma and surrounding objects.

In some embodiments, the system comprises a plasma measurement device, wherein the plasma measurement device comprises a CCD camera, an Optical Emission Spectrometer for visible and invisible emission, a Langmuir probe, a ball-pen probe, a magnetic (B-dot) probe, an energy analyzer, a thermocouple, an infrared optical pyrometer, a proton radiography, an absorption spectrometer, a beam emission spectrometer, a laser-induced fluorescence, or an electron cyclotron emission detector.

In some embodiments, the system comprises a controller for moving the device in response to a measurement from a plasma measurement device.

In some embodiments, the system comprises a controller coupled to the device and to a plasma measurement device, wherein the controller is configured to optimize the characteristic of the plasma using a feedback mechanism using measurements from the plasma measurement device to move the device.

G. The current disclosure includes a system comprising a chamber, an energy coupling configuration coupled to the chamber, wherein the energy coupling configuration is configured to introduce energy into the chamber to form a plasma in the chamber; The system further comprises a movable device coupled to the chamber, wherein the movable device is disposed in a vicinity of the plasma. The movable device is further configured to change a characteristic of the plasma formed by the energy coupling configuration. The system further comprises a feedback mechanism configured to optimize the characteristic of the plasma by moving the movable device relative to a signal received from a plasma measurement device.

In some embodiments, the feedback mechanism comprises a controller for moving the device in response to the signal.

In some embodiments, the feedback mechanism comprises a controller coupled to the device and to the plasma measurement device. The controller is further configured to optimize the characteristic of the plasma using the feedback mechanism by using measurements from the plasma measurement device to move the device.

In some embodiments, the feedback mechanism is configured to be manually performed by using measurements from the plasma measurement device to move the device.

In some embodiments, the feedback mechanism is configured to be automatically performed by using measurements from the plasma measurement device to move the device.

H. A method comprises forming a plasma in a chamber to optimize a characteristic or a configuration of the plasma by operating on a device disposed in a vicinity of the plasma while observing the characteristic or the configuration of the plasma through a plasma measurement device.

In some embodiments, operations on the device comprise moving or rotating the device continuously.

In some embodiments, operations on the device comprise moving or rotating the device to a fixed location.

In some embodiments, operations on the device comprise moving to a different location relative to the plasma, rotating around an axis, rotating around a point, changing to a different orientation relative to the plasma, or any combination thereof.

In some embodiments, operations on the device comprises extending, retracting, rotating around an axis, rotating around a point, or any combination thereof.

In some embodiments, operations on the device comprises at least one of moving the device relative to the plasma, flowing a gas to an area inside the plasma or toward the plasma, or extracting a gas from an area inside the plasma or from a vicinity of the plasma.

In some embodiments, operations on the device comprise heating or cooling the device.

In some embodiments, plasma is optimized for a deposition or an etch process on a substrate disposed in the chamber.

In some embodiments, the method further comprises introducing a substrate in the chamber, and optimizing the plasma with respect to conditions for depositing a layer on the substrate.

In some embodiments, the method further comprises introducing a substrate in the chamber, optimizing the plasma toward the substrate, or depositing a layer on the substrate using the optimized plasma.

In some embodiments, the method further comprises introducing a substrate in the chamber, or optimizing the plasma with respect to conditions for etching a layer on the substrate.

In some embodiments, the method further comprises introducing a substrate in the chamber, optimizing the plasma toward the substrate, or etching a layer on the substrate using the optimized plasma.

In some embodiments, the method further comprises wherein the plasma is optimized for a cleaning of an area of the chamber.

In some embodiments, the method further comprises optimizing the plasma toward an area of the chamber, or cleaning the area using the optimized plasma.

In some embodiments, the method further comprises manual.

In some embodiments, the method further comprises wherein the optimization is automatically performed by a controller controlling the device movement in response to the observed data from the plasma measurement device.

In some embodiments, the method further comprises extending or retracting the device until the optimized plasma characteristic or configuration is achieved.

In some embodiments, the method further comprises rotating the device until the optimized plasma characteristic or configuration is achieved.

In some embodiments, the method further comprises rotating the device to achieve improvements on the plasma characteristic or configuration or extending or retracting the device to obtain the optimized plasma characteristic or configuration.

Although the present disclosure and its advantages have been described in detail, it should be understood that various changes, substitutions and alterations can be made herein without departing from the spirit and scope of the disclosure as defined by the following claims.

What is claimed is:

1. A system comprising
a chamber;
an energy coupling configuration coupled to the chamber,
    wherein the energy coupling configuration is configured to introduce energy into the chamber to form a plasma in the chamber;
a movable rod passing through a wall of the chamber,
    wherein the movable rod is hollow to provide a fluid in or out of the chamber,
    wherein a tip of the movable rod is disposed in a vicinity of the plasma formed by the energy coupling configuration,
    wherein the movable rod is configured to change a characteristic of the plasma formed by the energy coupling configuration;
a controller configured to optimize the characteristic of the plasma through a feedback mechanism including a control algorithm comprising controlling movements of the movable rod in response to a signal received from a plasma measurement device.

2. A system as in claim 1 further comprising
a stage disposed inside the chamber,
    wherein the stage is configured to define a part of a boundary condition of the chamber,
    wherein the stage is configured to support a substrate holder for supporting a substrate.

3. A system as in claim 1,
wherein the energy introduced by the energy coupling configuration comprises an energy in the form of a microwave, an electric, a magnetic field, a combination of electric field and magnetic field, or a combination of a microwave and at least one of an electric field or a magnetic field.

4. A system as in claim 1,
wherein the energy coupling configuration comprises a microwave resonator configured to form the plasma.

5. A system as in claim 1,
wherein the characteristic of the plasma comprises at least one of an energy distributions, a plasma density distribution, a reaction species concentration and distribution, a temperature variation and distribution of the plasma, or a temperature variation and distribution of the plasma and surrounding objects.

6. A system as in claim 1,
wherein a movement, a position or an orientation of the movable rod is optimized to obtain a desired plasma characteristic or configuration.

7. A system as in claim 1,
wherein the movable rod is configured to generate a secondary plasma at the tip of the movable rod,
wherein the secondary plasma interacts with the plasma to modify a shape of the plasma.

8. A system as in claim 1,
wherein the movable rod is coupled to a gaseous source for delivering a gas to the chamber,
wherein the delivered gas is configured to change a shape of the plasma.

9. A system as in claim 1,
wherein the movable rod is configured to modify the plasma to provide a plasma over an area of the chamber wall, another wall of the chamber, or of a substrate holder inside the chamber.

10. A system as in claim 1, further comprising
an actuator coupled to the movable rod,
wherein the actuator is configured to change an orientation of the movable rod.

11. A system as in claim 1, further comprising
an actuator coupled to the movable rod,
wherein the actuator is configured to rotate the movable rod.

12. A system as in claim 1,
wherein the movable rod is coupled to an inert source for delivering an inert gas to an area of the chamber,
wherein the delivered inert gas is configured to minimize a reaction rate at the area.

13. A system as in claim 1,
wherein the movable rod is coupled to a vacuum source for removing a gas from the chamber,
wherein the gas removal is configured to change a chemistry or a shape of the plasma.

14. A system as in claim 1,
wherein the tip of the movable rod comprises a disk, a sphere, a spear shape, or a bent rod.

15. A system as in claim 1,
wherein the tip of the movable rod comprises a two-prong probe.

16. A system as in claim 1,
wherein the tip of the movable rod comprises a donut shape.

17. A system as in claim 1,
wherein the tip of the movable rod comprises double concentric rings configured to shape the plasma into two plasma rings.

18. A system as in claim 1,
wherein the tip of the movable rod comprises a rod configured to shape the plasma into a cylindrical shape.

19. A system as in claim 1,
wherein the tip of the movable rod comprises a ring configured to shape the plasma into a donut shape.

* * * * *